United States Patent [19]

Gerome et al.

[11] Patent Number: 5,278,385

[45] Date of Patent: Jan. 11, 1994

[54] METHOD OF PRODUCING FLEXIBLE PRINTED CIRCUITS, PRINTED CIRCUIT PRODUCED BY THIS METHOD AND DEVICE FOR CARRYING OUT THIS METHOD

[75] Inventors: Jacques Gerome, Kingersheim; Jean-Jacques Ambrose, Joncherey, both of France

[73] Assignee: Nicolitch S.A., France

[21] Appl. No.: 752,562

[22] PCT Filed: Jan. 3, 1991

[86] PCT No.: PCT/FR91/00001

§ 371 Date: Sep. 10, 1991

§ 102(e) Date: Sep. 10, 1991

[87] PCT Pub. No.: WO91/11090

PCT Pub. Date: Jul. 25, 1991

[30] Foreign Application Priority Data

Jan. 11, 1990 [FR] France .................. 90 00412

[51] Int. Cl.⁵ .............................................. B23K 26/00
[52] U.S. Cl. .......................... 219/121.68; 219/121.69; 219/121.82
[58] Field of Search ............. 219/121.69, 121.82, 219/121.68, 121.78; 156/643; 29/610.1, 612

[56] References Cited

U.S. PATENT DOCUMENTS 4,769,523 9/1988 Tanimoto et al. .
4,894,115 1/1990 Eschelberger et al. ............. 156/643
4,907,341 3/1990 Chapel, Jr. et al. ................. 29/612

FOREIGN PATENT DOCUMENTS 0080651 6/1983 European Pat. Off. .
0168351 1/1986 European Pat. Off. .
0307766 3/1989 European Pat. Off. .
3608410 9/1987 Fed. Rep. of Germany .

OTHER PUBLICATIONS

Electronic Packaging and Production. vol. 28, No. 8, Aug. 8, 1988, Newton, Massachusetts pp. 32–34; Fjelstad: "Design guidelines for flexible circuits".

*Primary Examiner*—C. L. Albritton
*Attorney, Agent, or Firm*—Davis, Bujold & Streck

[57] ABSTRACT

The invention relates to a method which enables zones (10, 11) of a printed circuit (6) to be precisely and quickly exposed, both on the conductors (3) and to the side of these.

Work is carried out on a blank provided with an insulating coating (4, 5) which may cover its entire surface. The coating is acted upon the zones (10, 11) to be exposed by means of a machining head having one or more laser beams and being controlled by a computer which receives the coordinates of the zones. The power of the beam is modulated differently on the conductors (3) and to the side of them, just as it is to make holes in the circuit or cut it along its periphery.

The invention applies to the production of flexible printed circuits.

14 Claims, 3 Drawing Sheets

METHOD OF PRODUCING FLEXIBLE PRINTED CIRCUITS, PRINTED CIRCUIT PRODUCED BY THIS METHOD AND DEVICE FOR CARRYING OUT THIS METHOD

The present invention relates to a method of producing printed circuits, in particular flexible printed circuits, by removing material on a blank comprising a dielectric substrate, flat metallic conductors bonded to an upper face of the substrate and an insulating coating covering substantially the entire extent of the printed circuit, in which material covering at least one defined zone of a conductor is removed so as to expose at least one of its faces.

The invention also relates to a printed circuit produced by this method.

Finally, the invention relates to a device for carrying out this method of producing printed circuits, in particular flexible printed circuits, by removing material on a blank comprising a dielectric substrate, flat metallic conductors bonded to an upper face of the substrate and an insulating coating covering substantially the entire extent of the printed circuit, this removed material being that covering at least one defined zone of a conductor, so as to expose at least one of its faces, the device comprising a support for a blank, a machining head designed to machine the blank by removing material and control and displacement means to activate the machining head and displace the latter and the blank relative to one another.

In a conventional method of producing printed circuits, in particular flexible printed circuits, the latter are coated with an insulating film which is held by an adhesive and covers the entire substrate and the conductors, except over connection zones and zones provided on the conductors and to the side of the latter for connecting or mounting electrical components. The insulating film is prepared before being placed on a substrate provided with a series of printed circuits. The preparation of the insulating film consists of cutting it into sizes covering several circuits and in punching, drilling or milling holes therein which will leave clear the connection and bare zones. The prepared insulating film is then manually positioned on the substrate by means of visual marks or using a template. It is held in position by adhesive bonding at several points, after which the assembly is hot-pressed so as to make the insulator adhere perfectly over its entire surface. The result is thus a strip of circuits ready to be cut up. This method, which uses manual positioning, is not very productive, particularly if the connection zones and the bare zones are numerous and have a small surface area.

A more efficient method, as defined in the introduction, is described in the Japanese publication Sho. 58 132 996. It consists of applying the insulating film over approximately the entire surface of the substrate, then removing it from the zones to be exposed by means of tools employing lateral ultrasonic vibration. One disadvantage of this method is that it is rather slow if a simple tool is used, otherwise a highly complex set of tools has to be available for each circuit type. Nor is the precision obtained sufficient for fine tracks. A further disadvantage which is inherent in this type of method is that, due to the projecting position of the conductors on the substrate, it does not allow the zones of the substrate which are adjacent to a conductor or located between two adjacent conductors to be cleared, and this clearing process is necessary to ensure good electrical contact between the conductor and the corresponding connector element.

The object of the present invention is therefore is provide a method which enables the above-mentioned disadvantages to be avoided and both the conductor zones and the adjacent zones on the substrate to be precisely and quickly exposed, without requiring a specific set of tools for each type of part which is processed.

With the object in view, the invention provides a method of the type specified in the introduction which is charaterised in that material is removed by heat by means of at least one laser beam from at least one defined zone of a conductor and/or at least one zone adjacent to a conductor.

The power of the laser beam is preferably modulated in accordance with the position of the point of incidence of the beam on the blank. The power of the laser beam on the said zone of the conductor may in particular differ from that on said zone adjacent to a conductor.

The material may be removed either on the side of the coating or on the side of the substrate. In an advantageous form of the method the blank is provided with imprinted marks in positions which are defined with respect to the conductors, these marks are automatically detected by means of an optical sensor coupled to a computer, which controls the laser beam, and the relative displacements between the laser beam and the blank, as well as the power of the beam, are controlled in accordance with this detection.

Holes may be made through the blank by means of the laser beam. If the blank contains several distinct printed circuits, these circuits may be separated by cutting the blank by means of the laser beam after the material removal operation.

Should the said coating be formed by an insulating film applied to a polymerizable adhesive layer, according to an advantageous form of the method, in order to remove the insulating film from a zone, it is cut by means of the laser beam along the periphery of the zone, while the adhesive is either incompletely polymerized or not at all, the film and the adhesive are withdrawn from this zone and the adhesive disposed outside of this zone is subsequently polymerized.

In order to carry out this method, the invention proposes a device of the type mentioned in the introduction which is characterized in that the machining head is provided with at least one modulated power laser beam emitter, and in that the control and displacement means comprise a computer which controls the machining head and is coupled to a memory in which coordinates of the zones to be machined on the blank are stored.

The emitter is preferably of the modulated power type.

In an advantageous embodiment the support comprises a cylinder which can be rotate about its axis, and the machining head can execute a translational movement parallel to this axis.

If the blank is a strip containing several printed circuits, the support may comprise several parallel cylinders of which at least one can be adjusted in position with respect to the others and about which the strip forms a continuous loop.

The device preferably comprises at least one optical sensor which is coupled to the computer and designed to detect marks on the blank.

The optical sensor is preferably a camera.

A better understanding of the present invention and its advantages will be obtained from the description of various embodiments, with reference to the accompanying drawings, in which.

Figure 5:
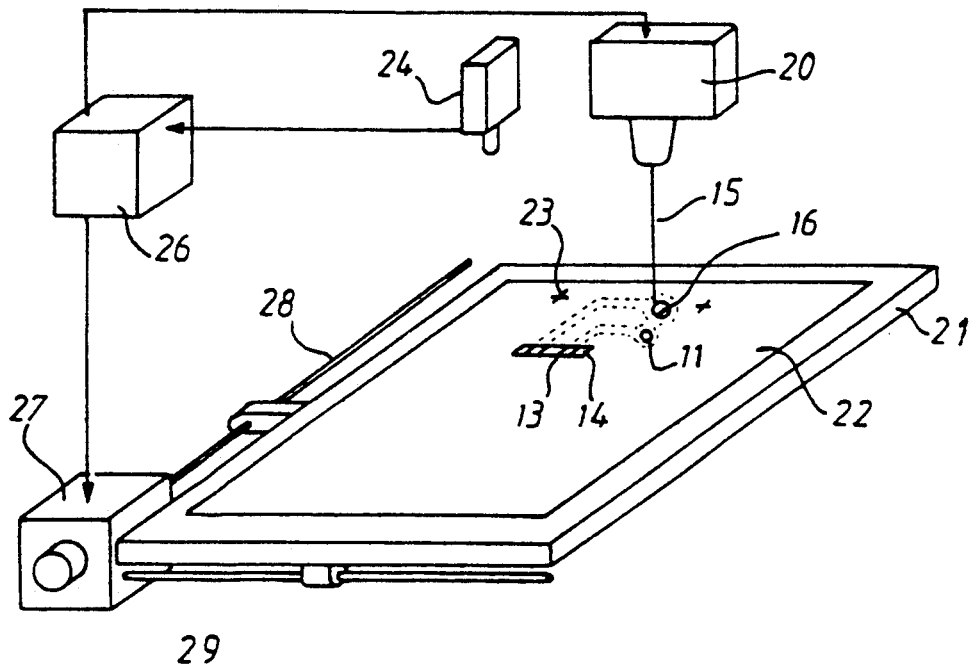
Figure 6:
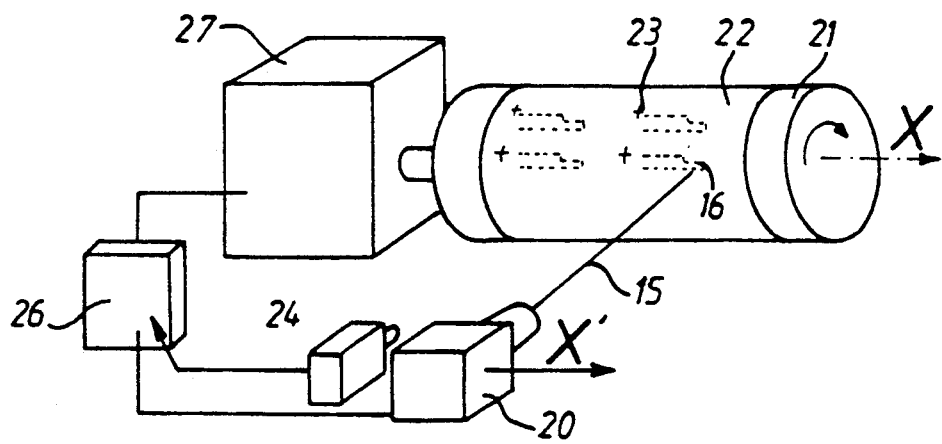
Figure 7:
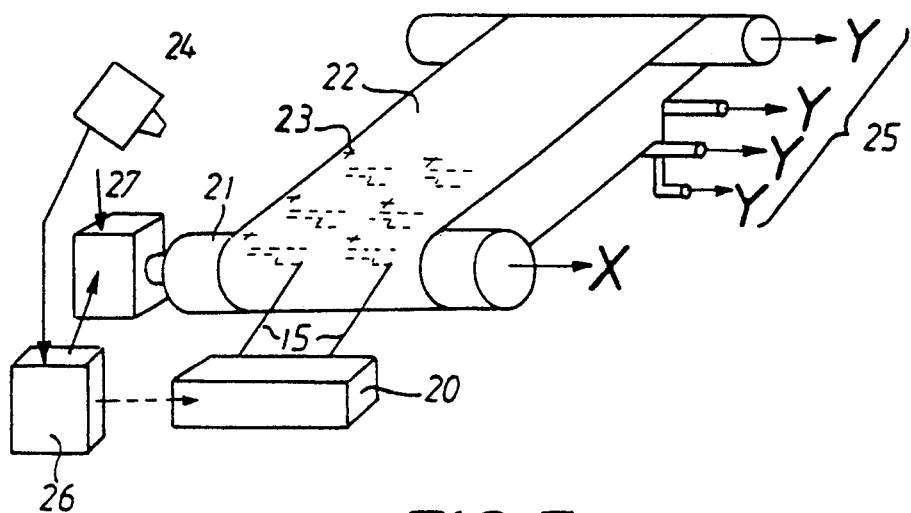
Figure 8:
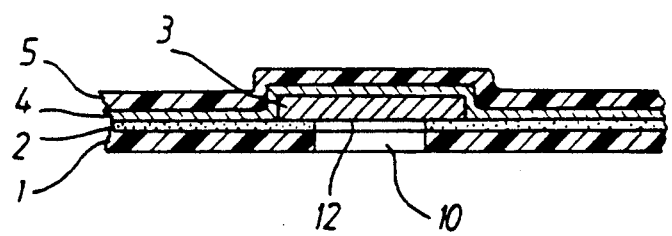
Figure 9:
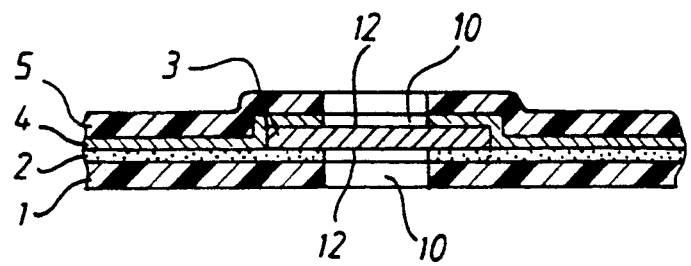

FIG. 5 shows in diagrammatic form an embodiment of a device according to the invention which comprises a support in the form of a table which can move in its plane with respect to a machining head, FIG. 6 shows an embodiment of the device which comprises a support in the form of a rotary cylinder opposite which the machining head moves, FIG. 7 shows another embodiment of the device in which a strip of printed circuits forms a closed loop which winds partly round a cylinder disposed opposite the machining head and round a set of rollers which can be adjusted in terms of their position, FIG. 8 is a partial sectional view of a printed circuit in which the substrate and the bonding agent under a conductor have been machined to clear the conductor, and FIG. 9 is a partial sectional view of a printed circuit in which a conductor has been exposed on both sides.

Figure 3:
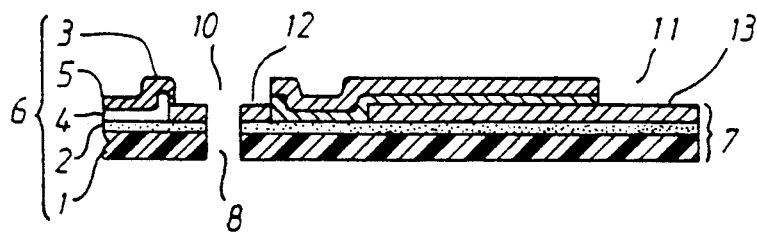
FIG. 3 is a sectional view along the line III—III in FIG. 1.
Figure 1:
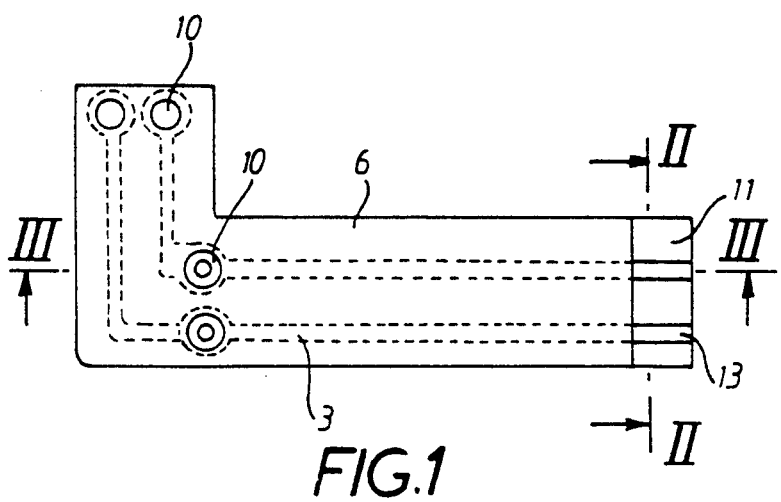
FIG. 1 is a plan view of a finished printed circuit produced according to the invention.
Figure 2:
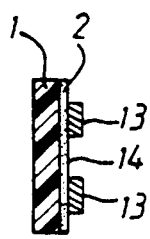
FIG. 2 is a sectional view along the line II—II in FIG. 1.

Referring now to FIGS. 1 to 3, the printed circuit 6 to be produced must comprise a flexible substrate formed by a dielectrical sheet 1 covered by a bonding layer 2 on which are held flat metallic conductors 3 which are produced by any method from the printed circuit field. A coating consisting of an insulating film 5 held by an adhesive 4 has been placed over the entire upper surface of the assembly 7 formed by the layers 1, 2 and 3. This coating then has to be removed from certain zones so as to obtain clear spaces 10 where the metal of the conductors 3 is exposed and where, if necessary, holes 8 may be made through the circuit, and a clear space 11 which is preferably disposed at one end of the circuit and is intended to be linked to one or more connectors. The clear space 11 reveals connection zones 13 on the conductors and bar zones 14 adjacent to the zones 13 on the substrate 1 or on the bonding layer 2.

Figure 4:
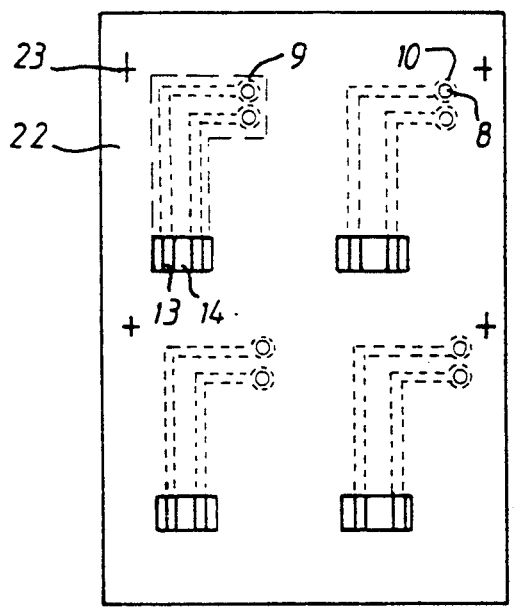
FIG. 4 shows a strip bearing several printed circuits before it is finally cut.

As shown in FIG. 4, several printed circuits 6 are generally produced from a blank in the form of a strip 22, which is coated with layers 4 and 5 over its entire surface. After the clear spaces 10 and 11 and, if necessary, the holes 8 have been produced, each circuit is cut out of the strip 22 along its periphery 9. The strip 22 is also provided with imprinted marks 23, for example in the form of crosses.

The device illustrated in FIG. 5 comprises a machining head 20 disposed opposite a mobile support in the form of a table 21 to which the blank consisting of the strip 22 is secured. The machining head 20 comprises a laser emitter which emits a laser beam 15 extending perpendicular to the table 21 and reaching a point 16 on the strip 22. The head 20 may in fact comprise several laser emitters producing parallel beams. An optical sensor 24 is provided in the vicinity of the head 20 and is designed to detect a mark 23 passing in front of it and transmit this information to a computer 26 provided with a memory in which the coordinates of the marks 23 and of points defining the clear spaces 10 and 11 to be produced on the printed circuits are in particular stored. The computer 26 controls both the operation of the laser emitter of the head 20 and a displacement unit 27, which displaces the table 21 in two perpendicular directions, for examples by means of screw mechanism 28, 29.

A particularly advantageous aspect of the operation of the device is that the power of the laser beam 15 is modulated in a programmed manner for each point of incidence 16 on the circuits. For example, the power of the beam is adjusted in a clear space 11 for the connectors so as to destroy the insulating film 5 and the adhesive 4 on the connection zones 13 of the conductors to a degree which differs from that on the adjacent bare zones 14. This in particular makes it easier to clear the edges of the conductors 3, where, as can be seen in FIG. 3, the coating formed by the layers 4 and 5 is thicker. The power of the laser beam may also be modulated differently tot make the holes 8 and to cut the periphery 9 of the circuits or to act on the sheet 22 underneath so as to expose a conductor by local ablation oof the sheet 1 and of the bonding layer 2. The power for each point 16 is defined beforehand and this information is stored in the memory associated with the computer 26. The latter can therefore control the power of the beam at the same time as the displacements produced in the unit 27.

FIG. 6 shows another embodiment in which the blank strip 22 is secured to the periphery of a support formed by a cylinder 21 made to rotate about its axis X by the unit 27. In this case the machining head 20 is mounted such that it can execute a translational movement along an axis X', which is parallel to the axis X, and it emits one or more laser beams 15 perpendicular to the axis X. The head 20 advances slowly while the cylinder rotates, so that the result is a continuous movement which may be faster and more regular than an alternating sweeping movement. The head is advanced for each rotation by a step which approximates the width of the laser beam 15, which thus sweeps the entire surface of the strip 22 with a power and at a point in time which depend on the cylindrical coordinates of the point of incidence 16 on the strip 22. This embodiment, in which the strip 22 is completely wound round the cylindrical support 21, is particularly suitable for small circuits, the development of which in one direction does not exceed the circumference of the support, and for small-lot production, which does not involve large material surface areas.

A somewhat similar variant is shown in FIG. 7. In this case the strip 22 is continuous and forms a closed loop which winds partly round the cylindrical support 21 and round a set of rollers 25 whose axes Y are parallel to the axis X of the cylindrical 21. This solution enables a long strip to be used, and this is suitable for large circuits or mass production. The position of the rollers 25 with respect to one another or with respect to the cylinder 21 can preferably be adjusted in accordance with the length of the strip 22 to be machined.

It should be noted, in connection with the various embodiments illustrated in FIGS. 5 to 7, that the use of the marks 23 and of the optical detector 24 advantageously renders it unnecessary to place the strip 22 in a predetermined and precise position on the support 21 and even enables deviations or deformations of the strip to be corrected it the coordinates of the points of incidence 16 are distance from each mark 23, which will be placed as close as possible to the clear spaces 10 and 11.

The same marks may be used for drilling the holes 8, generally in a second phase following the production of the clear spaces 10 and 11, and for cutting the periphery 9 of the circuits by means of the laser beam(s) 15.

In a varient of the method, which may be of advantage for creating clear spaced 10, 11 having a large surface area, a strip 22 is used whose adhesive 4 is either incompletely polymerized or not at all on the zones of the clear spaces 10 and 11, with complete polymerization only taking place after these clear spaces have been produced. Due to this solution, the laser beam need only sweep the periphery of the clear spaces 10, 11, thus cutting out chips which may be mechanically withdrawn, instead of having to be burnt or vaporized over their entire surface. This saves time and energy.

FIG. 8 shows an example in which a clear space 10 has been created on a connection zone 12 of a conductor 3 through the substrate sheet 1 and the bonding layer 2. In FIG. 9 a clear space 10 of the this kind has been provided on each face of the conductor 3. In order to act on the underneath of the strip 22, this may be turned over or a laser machining head may be fitted underneath it.

The present invention is not limited to the embodiments described above, but rather applies to all modications and variants obvious to the person skilled in the art. The method according to the invention covers not just the production of printed circuits whose coating is formed by a bonded film, but also circuits coated with a film which is applied in liquid form and then hardened.

We claim:

1. A method of producing a printed circuit with a laser beam from a blank (22) comprising a dielectric substrate (1), a plurality of flat metallic conductors bonded by a first adhesive (2) to a first surface of the dielectric substrate to form at least part of an electrical circuit, and an insulating coating (5) substantially entirely covering the first surface of the dielectric substrate and secured thereto by a second adhesive (4), said method comprising the steps of:
defining and storing a memory of a calculator, prior to use, a power value of the laser beam necessary for removing material covering at least one defined zone overlying at least one of said plurality of flat metallic conductors of a said blank,
simultaneously removing at least one of:
1) the insulating coating and the second adhesive, and
2) the substrate and the first adhesive
from each impact point (16) of the laser beam on a said blank at a said previously defined and stored power value whereby material, of said at least one defined zone, covering at least one of said plurality of flat metallic conductors is removed by the laser beam (15) so as to expose at least one of a portion of that said at least one flat metallic conductor and an area (14) adjacent that said at least one flat metallic conductor.

2. A method according to claim 1, further comprising the step of varying the power of the laser beam for a said defined zone (12, 13) of a said flat metallic conductor from that for a said area (14) adjacent to that said flat metallic conductor.

3. A method according to claim 1, further comprising the step of removing material from at least two opposed surfaces of a said blank (22).

4. A method according to claim 1, further comprising the steps of providing imprinted marks (23) on a said blank (22) at defined positions with respect to said plurality of flat metallic conductors,
automatically detecting the imprinted marks by means of an optical sensor (24) coupled to a computer (26) controlling the laser beam, and
controlling relative displacements between the laser beam and a second blank as well as controlling the power of the laser beam in accordance with the automatic detection.

5. A method according to claim 1, further comprising the step forming holes (8) through a said blank by means of the laser beam.

6. A method according to claim 1, wherein a said blank (22) contains several distinct printed circuits (6), and said method further comprising the step of separating the several distinct printed circuit by cutting that said blank via the laser beam after removing the material.

7. A method of producing a printed circuit, in particular a flexible printed circuit, with a laser beam from a blank (22) comprising a dieletric substrate (1), a plurality of flat metallic conductor bonded by a first adhesive (2) to a first surface of the dielectric substrate form at least part of an electrical circuit, and an insulating film (5) substantially entirely covering the first surface of the dielectric substrate and secured thereto by a polymerizable adhesive (4), said method comprising the steps of:
defining and storing in a memory of a calculator, prior to use, a power value of the laser beam necessary for removing material covering at least one defined zone overlying at least one of said plurality of flat metallic conductors of a said blank,
cutting along the periphery of a said desired zone via the laser beam, prior to the adhesive being completely polymerized, to remove in one pass at least one of:
1) the insulating coating and the second adhesive, and
2) the substrate and the first adhesive
from each impact point (16) of the laser beam on a said blank at a said previously defined and stored power value whereby material, of said at least one defined zone, covering at least one of said plurality of flat metallic conductors is removed so as to expose at least one of a portion of that said at least one flat metallic conductor and an area (14) adjacent to that said at least one flat metallic conductor,
subsequently polymerizing at least said second adhesive (4) disposed outside of this desired zone.

8. A printed circuit when produced by the method according to claim 1.

9. A device for carrying out the method of producing printed circuits, in particular flexible printed circuits, by removing via a laser beam material from a blank comprising a dielectric substrate (1), a plurality of flat metallic conductors bonded by a first adhesive (2) to a first surface of the dielectric substrate to form at least part of an electrical circuit, and an insulating coating (5) substantially entirely covering the first surface of the dielectric substrate and secured thereto by a second adhesive (4), said method comprising the steps of defining and storing in a memory of a calculator, prior to use, a power value of the laser beam necessary for removing material covering at least one defined zone overlying at least one of said plurality of flat metallic conductors of a said blank, simultaneously removing at least one of (1) the insulating coating and the second adhesive, and 2)

the substrate and the first adhesive from each impact point (16) of the laser beam on a said blank at a said previously defined and stored power value whereby material, of said at least one defined zone, covering at least one of said plurality of flat metallic conductors is removed by the laser beam (15) so as to expose at least one of a portion of that said at least one flat metallic conductor and an area (14) adjacent that said at least one flat metallic conductor, said device comprising a support for a said blank, a machining head designed to machine a said blank by removing material from at least one surface thereof, the machining head (20) being provided with at least one emitter of a laser beam (15), and control displacement means for controlling and displacing the laser beam and the blank relative to one another, the control and displacement means comprising a computer (26), controlling the machining head (20), coupled to a memory storing and coordinating the zones to be machined on a said blank (22).

10. A device according to claim 9, wherein said at least one emitter is a modulated power type emitter.

11. A device according to claim 9, wherein the support comprises a cylinder (21) which can rotate about an axis, and the laser beam can execute a translational movement parallel to said rotational axis.

12. A device according to claim 11, wherein each said blank is a continuous strip (22) containing several printed circuits (6), the support comprises a plurality of parallel cylinder (25) about which the continuous strip forms a continuous loop, and at least one of said plurality of parallel cylinders is adjustable with respect to the other of said plurality of parallel cylinders.

13. A device according to claim 9, wherein said device further comprises at least one optical sensor (24) which is coupled to said computer (26) to detect imprinted marks (23) on a said blank.

14. A device according to claim 13, wherein said at least one optical sensor is a camera.

* * * * *